US007371975B2

(12) United States Patent
Dory et al.

(10) Patent No.: US 7,371,975 B2
(45) Date of Patent: May 13, 2008

(54) ELECTRONIC PACKAGES AND COMPONENTS THEREOF FORMED BY SUBSTRATE-IMPRINTING

(75) Inventors: Thomas S. Dory, Gilbert, AZ (US); Michael Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 10/322,902

(22) Filed: Dec. 18, 2002

(65) Prior Publication Data

US 2004/0118604 A1 Jun. 24, 2004

(51) Int. Cl.
*H01R 12/04* (2006.01)

(52) U.S. Cl. ...................... 174/262; 174/268; 361/767; 29/825

(58) Field of Classification Search ................ 174/262, 174/263, 266, 268; 361/767-776; 29/825, 29/829, 830, 846-852
See application file for complete search history.

(56) References Cited

U.S. PATENT DOCUMENTS

| | | | | |
|---|---|---|---|---|
| 2,912,748 | A | 11/1959 | Eric | |
| 2,986,804 | A | 6/1961 | Greenman et al. | |
| 3,438,127 | A | 4/1969 | Lethonen | |
| 3,628,243 | A | 12/1971 | Phol et al. | |
| 4,356,627 | A | 11/1982 | Hoffman | |
| 4,651,417 | A | 3/1987 | Schumacher, III et al. | 29/848 |
| 4,912,844 | A | 4/1990 | Parker | 29/848 |
| 5,043,184 | A | 8/1991 | Fujii et al. | |
| 5,091,339 | A | 2/1992 | Carey | |
| 5,259,110 | A | 11/1993 | Bross et al. | |
| 5,528,001 | A | 6/1996 | Roberts | |
| 5,830,563 | A | 11/1998 | Shimoto et al. | |
| 5,928,767 | A * | 7/1999 | Gebhardt et al. | 428/209 |
| 6,005,198 | A * | 12/1999 | Gregoire | 174/262 |
| 6,080,656 | A | 6/2000 | Shih et al. | |
| 6,127,196 | A | 10/2000 | Butera et al. | 438/15 |
| 6,140,234 | A | 10/2000 | Uzoh et al. | |
| 6,156,221 | A | 12/2000 | Lauffer et al. | |
| 6,156,870 | A | 12/2000 | Morita et al. | |

(Continued)

FOREIGN PATENT DOCUMENTS

CN 1279251 1/2001

(Continued)

OTHER PUBLICATIONS

"U.S. Appl. No. 10/323,165 Final office action mailed Jun. 5, 2007", 9 pgs.

(Continued)

*Primary Examiner*—Jerry C. Norris
*Assistant Examiner*—Yuriy Semenenko
(74) *Attorney, Agent, or Firm*—Schwegman, Lundberg & Woessner, P.A.

(57) ABSTRACT

A package includes at least one electronic component mounted on a substrate formed through imprinting. In an embodiment, the substrate may comprise conductive traces, vias, and patterns of lands on one or more layers. Conductor features of different geometries may be formed by imprinting them simultaneously on one or both surfaces of an imprintable tape. Fabrication apparatus and methods, as well as application of the imprinted package to an electronic assembly, are also described.

25 Claims, 8 Drawing Sheets

U.S. PATENT DOCUMENTS

| | | | | |
|---|---|---|---|---|
| 6,254,972 | B1 | 7/2001 | Farquhar et al. | |
| 6,410,418 | B1 | 6/2002 | Yang | |
| 6,422,528 | B1 | 7/2002 | Domeier et al. | |
| 6,482,742 | B1 | 11/2002 | Chou | |
| 6,511,912 | B1 | 1/2003 | Chopra et al. | |
| 6,783,652 | B2 * | 8/2004 | Iijima et al. | 205/125 |
| 6,974,775 | B2 | 12/2005 | Keser et al. | |
| 2003/0135998 | A1 | 7/2003 | Walz et al. | |
| 2004/0118594 | A1 | 6/2004 | Dory et al. | |
| 2004/0124533 | A1 | 7/2004 | Keser et al. | |

FOREIGN PATENT DOCUMENTS

| | | | |
|---|---|---|---|
| GB | 2212332 | * | 11/1987 |
| JP | 11-186698 | * | 9/1999 |
| JP | 00-124581 | | 4/2000 |
| WO | WO-01/50825 | * | 7/2001 |
| WO | WO-01/50825 A1 | | 7/2001 |
| WO | WO-0150825 | * | 7/2001 |

OTHER PUBLICATIONS

"U.S. Appl. No. 10/323,165 Final office action mailed Jun. 6, 2006", 9 pgs.

"Method to Control the Geometry and Vertical Profile of Via Holes in Substrate Materials", *IBM Technical Disclosure Bulletin, 35*, (Oct. 1, 1992),211-216.

"U.S. Appl. No. 10/323,165 Non-final office action mailed Jan. 6, 2006", 11 pgs.

"U.S. Appl. No. 10/323,165 Non-final office action mailed Jan. 18, 2007", 7 pgs.

"U.S. Appl. No. 10/323,165 Response filed Mar. 16, 2007 to non-final office action mailed Jan. 18, 2007", 12 pgs.

"U.S. Appl. No. 10/323,165 Response filed Apr. 6, 2006 to non-final office action mailed Jan. 6, 2006", 15 pgs.

"U.S. Appl. No. 10/323,165 Response filed Aug. 6, 2007 in response to Final Office Action mailed Jun. 5, 2007", 12 pgs.

"U.S. Appl. No. 10/323,165 Response filed Oct. 12, 2006 in response to Final Office Action mailed Jun. 12, 2006", 12 pgs.

"U.S. Appl. No. 10/335,187 Final Office Action mailed Mar. 9, 2005", 9 pgs.

"U.S. Appl. No. 10/335,187 Non-Final Office Action mailed Sep. 15, 2004", 9 pgs.

"U.S. Appl. No. 10/335,187 Response filed Jan. 17, 2006 in response to Non-Final Office Action mailed Sep. 15, 2005", 14 pgs.

"U.S. Appl. No. 10/335,187 Response filed Jun. 9, 2005 in response to Final Office Action mailed Mar. 9, 2005", 14 pgs.

"U.S. Appl. No. 10/335,187 Final Office Action mailed Feb. 3, 2004", 9 pgs.

"U.S. Appl. No. 10/335,187 Final Office Action mailed Mar. 23, 2006", 9 pgs.

"U.S. Appl. No. 10/335,187 Non-Final Office Action mailed Sep. 15, 2005", 8 pgs.

"U.S. Appl. No. 10/335,187 Non-Final Office Action mailed Sep. 16, 2003", 7 pgs.

"U.S. Appl. No. 10/335,187 Response filed May 3, 2004 in response to Final Office Action mailed Feb. 3, 2004", 12 pgs.

"U.S. Appl. No. 10/335,187 Response filed Nov. 17, 2003 in response to Non-Final Office Action mailed Sep. 16, 2003", 12 pgs.

"U.S. Appl. No. 10/335,187 Response filed Dec. 15, 2004 in response to Non-Final Office Action mailed Sep. 15, 2004", 18 pgs.

Tormen, M., et al., "Thermocurable Polymers as Resists for Imprint Lithography", *Electronics Letters, 36*, (May 25, 2000),983-984.

"U.S. Appl. No. 10/335,196 Non-Final Office Action mailed May 28, 2004", 14 pgs.

"U.S. Appl. No. 10/335,196 Notice of Allowace mailed Mar. 2, 2005", 8 pgs.

"U.S. Appl. No. 10/335,196 Notice of Allowance mailed Jun. 21, 2005", 10 pgs.

"U.S. Appl. No. 10/335,196 Response filed Nov. 29, 2004 filed in response to Non-Final Office Action mailed May 28, 2004", 11 pgs.

* cited by examiner

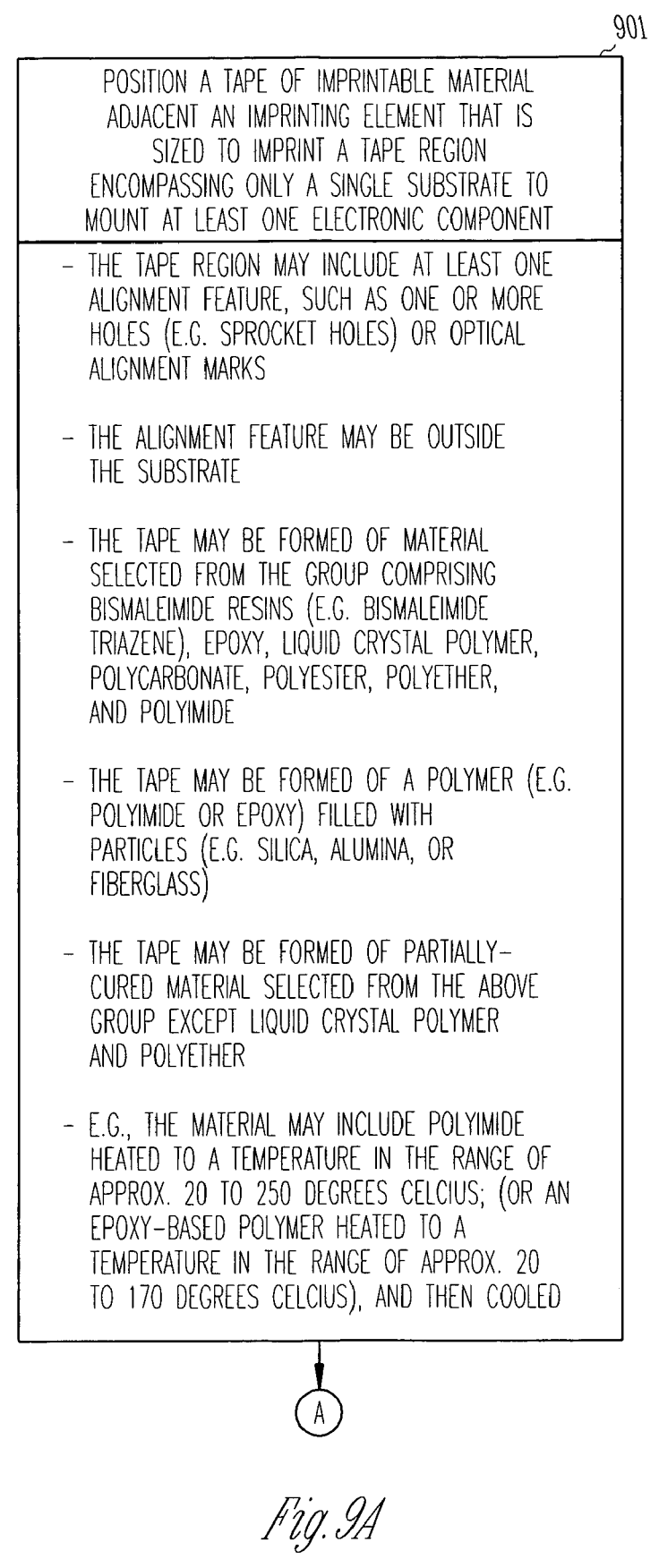

901

POSITION A TAPE OF IMPRINTABLE MATERIAL ADJACENT AN IMPRINTING ELEMENT THAT IS SIZED TO IMPRINT A TAPE REGION ENCOMPASSING ONLY A SINGLE SUBSTRATE TO MOUNT AT LEAST ONE ELECTRONIC COMPONENT

- THE TAPE REGION MAY INCLUDE AT LEAST ONE ALIGNMENT FEATURE, SUCH AS ONE OR MORE HOLES (E.G. SPROCKET HOLES) OR OPTICAL ALIGNMENT MARKS

- THE ALIGNMENT FEATURE MAY BE OUTSIDE THE SUBSTRATE

- THE TAPE MAY BE FORMED OF MATERIAL SELECTED FROM THE GROUP COMPRISING BISMALEIMIDE RESINS (E.G. BISMALEIMIDE TRIAZENE), EPOXY, LIQUID CRYSTAL POLYMER, POLYCARBONATE, POLYESTER, POLYETHER, AND POLYIMIDE

- THE TAPE MAY BE FORMED OF A POLYMER (E.G. POLYIMIDE OR EPOXY) FILLED WITH PARTICLES (E.G. SILICA, ALUMINA, OR FIBERGLASS)

- THE TAPE MAY BE FORMED OF PARTIALLY-CURED MATERIAL SELECTED FROM THE ABOVE GROUP EXCEPT LIQUID CRYSTAL POLYMER AND POLYETHER

- E.G., THE MATERIAL MAY INCLUDE POLYIMIDE HEATED TO A TEMPERATURE IN THE RANGE OF APPROX. 20 TO 250 DEGREES CELCIUS; (OR AN EPOXY-BASED POLYMER HEATED TO A TEMPERATURE IN THE RANGE OF APPROX. 20 TO 170 DEGREES CELCIUS), AND THEN COOLED (A)

*Fig. 9A*

ELECTRONIC PACKAGES AND COMPONENTS THEREOF FORMED BY SUBSTRATE-IMPRINTING

RELATED APPLICATIONS

The present application is related to the following applications, which are assigned to the same assignee as the present application:

(1) Ser. No. 10/323,165, entitled "Imprinted Substrate and Methods of Manufacture"; and (2) Ser. No. 10/335,187, entitled "Methods for Performing Substrate Imprinting using Thermoset Resin Varnishes and Products Formed Therefrom ".

TECHNICAL FIELD

The subject matter relates generally to electronics packaging. More particularly, the subject matter relates to an electronic package that includes an electronic component packaged on a substrate formed through imprinting, and to manufacturing apparatus and methods related thereto.

BACKGROUND INFORMATION

Integrated circuits (ICs) have typically been assembled into electronic packages by physically and electrically coupling them to a substrate made of organic or ceramic material. One or more such IC packages can be physically and electrically coupled to a secondary substrate such as a printed circuit board (PCB) or motherboard to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of packaging must provide increased performance while generally being smaller or more compact in size. As market forces drive equipment manufacturers to produce electronic systems with increased performance and decreased size, IC packaging accordingly also needs to support these requirements.

In addition, manufacturers of high-end IC packages, such as processors, are experiencing increasing demand for IC packages mounted in thin, light-weight, and/or resilient packaging, because such packaging is useful for many applications. For example, hand-held electronic systems, such as cellular telephones, palm-top computers, personal digital assistants, calculators, MP3 players, watches, hearing aids, and similar equipment typically requires ICs in thin, light-weight, and/or flexible packages.

An IC substrate may comprise a number of layers. Each layer may include a pattern of metal interconnect lines (referred to herein as "traces") on one or both surfaces. Each layer may also include vias to couple traces or other conductive structure on opposite surfaces of the layer.

An IC substrate typically includes one or more electronic components mounted on one or more surfaces of the substrate. The electronic component or components are functionally connected to other elements of an electronic system through a hierarchy of electrically conductive paths that include the substrate traces and vias. The substrate traces and vias typically carry signals that are transmitted between the electronic components, such as ICs, of the system. Some ICs have a relatively large number of input/output (I/O) terminals (also called "lands" or "pads"), as well as a large number of power and ground terminals.

Surface mount technology (SMT) is a widely known technique for coupling ICs to a substrate. In addition to using SMT to couple an individual IC die to a substrate, it is also well known to use SMT to couple an IC package to a substrate such as a printed circuit board (PCB) or motherboard, using solder bumps, for example.

The formation of conductor features, such as traces and vias, in a substrate typically requires a sequence of complex, time-consuming, and expensive operations that offer ample opportunities for error. For example, forming traces on a single surface of a substrate layer typically requires surface preparation, metallizing, masking, etching, cleaning, and inspecting. Forming vias typically requires drilling, using a laser or mechanical drill. Each process stage requires careful handling and alignment to maintain the geometric integrity of the myriad of traces, vias, and other features. To allow for alignment tolerances, feature sizes and relationships often must be kept relatively large, thus hindering significant reductions in feature density. For example, to provide sufficient tolerance for drilling vias, via pads are typically provided, and these consume significant "real estate".

Fabrication of a typical multi-layer substrate requires that a large number of process operations be performed. In a known example of a multi-layer substrate, a core layer has vias (also referred to herein as "plated through holes" or "PTHs") and traces. Traces may be formed on one or both surfaces of the core layer. One or more build-up layers, each with traces on one or more surfaces, and typically with PTHs, are formed. The features of the build-up layers can be formed while these layers are separate from the core layer, and the build-up layers may then be subsequently added to the core layer. Alternatively, some features of the build-up layers may be formed after such layers have been added to the core layer.

For the reasons stated above, and for other reasons stated below which will become apparent to those skilled in the art upon reading and understanding the present specification, there is a significant need in the art for methods of electronics packaging, and corresponding substrate fabrication apparatus, that minimize the complexity, time, and cost of fabricating substrates.

BRIEF DESCRIPTION OF THE DRAWINGS

FIGS. 9A and 9B together form a flow diagram illustrating a method of fabricating an imprinted substrate, using an imprintable tape, to mount an electronic component, in accordance with one or more embodiments of the invention.

DETAILED DESCRIPTION OF EMBODIMENTS OF THE INVENTION

In the following detailed description of embodiments of the invention, reference is made to the accompanying drawings that form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that mechanical, chemical, structural, electrical, and procedural changes may be made without departing from the spirit and scope of the present subject matter. The following detailed description is, therefore, not to be taken in a limiting sense, and the scope of embodiments of the present invention is defined only by the appended claims.

Figure 1:
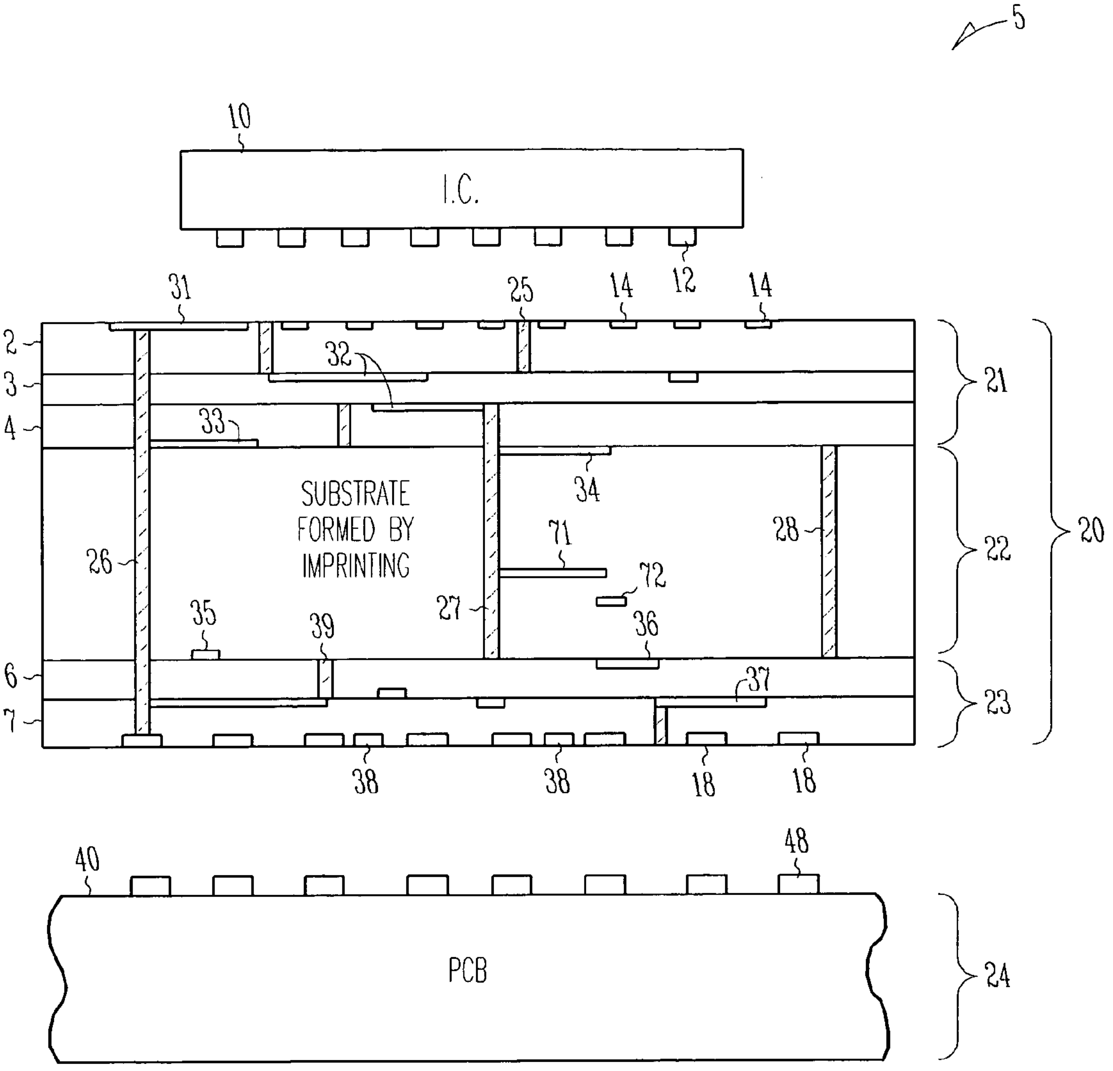
FIG. 1 illustrates a cross-sectional representation of an electronic assembly incorporating a substrate that is formed by imprinting, in accordance with an embodiment of the invention.

FIG. 1 illustrates a cross-sectional representation of an electronic assembly 5 incorporating a substrate 20 that is formed by imprinting, in accordance with an embodiment of the invention.

"Imprint", as used herein, means to form features in a material by forcing a tool against and/or into the material. Imprinting includes stamping, embossing, impressing, extruding, and like processes.

Electronic assembly 5 includes at least one integrated circuit (IC) 10 or other type of active or passive electronic component having a plurality of conductive mounting pads 12. The electronic component may be in either packaged or unpackaged form, as appropriate to the type of substrate 20. The IC 10 (or other type of electronic component) may be of any type, including a microprocessor, a microcontroller, a graphics processor, a digital signal processor (DSP), or any other type of processor or processing circuit. Other types of electronic components that may be included in electronic assembly 5 are a custom circuit, an application-specific integrated circuit (ASIC), or the like, such as, for example, one or more circuits (such as a communications circuit ) for use in wireless devices like cellular telephones, pagers, computers, two-way radios, and similar electronic systems. Electronic assembly 5 may form part of an electronic system (as defined in the Background section above).

IC 10 is physically and electrically coupled to substrate 20. In an exemplary embodiment, IC pads 12 are coupled to corresponding lands 14 on the upper surface of upper build-up section 21 through a suitable attachment mechanism such as solder balls or bumps (not shown).

"Suitable", as used herein, means having characteristics that are sufficient to produce the desired result(s). Suitability for the intended purpose can be determined by one of ordinary skill in the art using only routine experimentation.

Electronic assembly 5 may include an additional substrate, such as a printed circuit board (PCB) 24 (or interposer), below substrate 20. Substrate 20 may be physically and electrically coupled to PCB 24. In an exemplary embodiment, substrate pads 18 are coupled to corresponding lands 48 on the upper surface 40 of PCB 24 through a suitable attachment mechanism such as solder (not shown). PCB 24 can optionally have lands (not shown) on its lower surface for attachment to an additional substrate or other packaging structure in the packaging hierarchy.

In the example shown in FIG. 1, the substrate 20 comprises a core layer 22, an upper build-up section 21 of one or more layers, and a lower build-up section 23 of one or more layers. One of ordinary skill in the art will appreciate that many alternative embodiments are possible, including but not limited to a substrate comprising only a core layer; a substrate comprising a core with two or more upper and/or lower build-up layers; a substrate comprising a core with only upper build-up layer(s); a substrate comprising a core with only lower build-up layer(s); and so forth.

The various constituent layers of substrate 20 can be formed of any suitable material or combination of materials, such as organic or ceramic materials. In various exemplary embodiments, the substrate starting materials may comprise partially-cured organic materials, chemically or thermally softened organic materials, and green ceramic materials. Any other suitable type of material may be used, provided that it can receive an imprint and can retain such for a period of time long enough to permit the imprinted features, such as vias and trenches, to be formed into conductor features, as for example by inserting conductive material into the imprinted features.

"Conductor feature", as used herein, means any type of conducting element associated with a substrate, including vias (e.g. blind vias, through vias, etc.), conductors (e.g. surface traces, internal traces, conductive planes, etc.), mounting terminals (e.g. pads, lands, etc.), and the like.

"Via", as used herein, means any type of conducting element to provide a conductive path between different depths in a substrate. For example, a via can connect conductive elements on opposite surfaces of a substrate, and a via can connect conductive elements at different internal layers within a substrate.

"Trench", as used herein, means any type of conducting element to provide a conductive path at a relatively constant depth in a substrate. "Trench" includes traces, ground planes, and terminals. For example, a trace may connect conductive elements on one surface of a substrate. A ground plane may provide a conductive path at a relatively constant depth within a substrate. Terminals may provide conductive paths on one surface of a substrate.

Core layer 22, in the example shown in FIG. 1, comprises conductor features in the form of vias 26-28. Core layer 22 also comprises conductor features in the form of one or more trenches 34 in its upper surface, one or more trenches 35 in its lower surface, and one or more internal trenches (e.g. traces 71 and 72). Some or all of the conductor features may be formed through an imprinting process, as will be explained in greater detail below.

Core layer 22 may be formed in various ways. For example, core layer 22 may be formed as a single layer of material. Alternatively, core layer 22 may comprise multiple layers of material. In the example shown in FIG. 1, core layer 22 comprises multiple layers, and internal traces 71 and 72 are formed in the vicinity of the boundaries between individual layers. The boundaries between the multiple layers making up core layer 22 are not shown in FIG. 1. Internal traces 71 and 72 may be formed in any suitable manner, including a manner that is similar to or identical to that used to form trenches in upper build-up section 21 and lower build-up section 23, as will be explained in greater detail below.

Upper build-up section 21, in the example shown in FIG. 1, comprises three build-up layers 2-4. Upper build-up section 21 further comprises conductor features in the form of one or more vias 25 and 26, one or more trenches (e.g. trace 31 and lands 14) in the upper surface of layer 2, and one or more trenches 33 in the lower surface of layer 4. Upper build-up section 21 may further comprise internal trenches 32, which may be formed in the internal upper and/or lower surfaces of layers 2-4, such as in the lower surface of layer 2, the upper or lower surfaces of layer 3, and/or in the upper surface of layer 4.

Lower build-up section 23, in the example shown in FIG. 1, comprises two build-up layers 6-7. Lower build-up section 23 further comprises conductor features in the form of one or more vias 26 and 39, one or more trenches 36 in the upper surface of layer 6, and one or more trenches (e.g. traces 38 and pads 18) in the lower surface of layer 7. Lower build-up section 23 may further comprise one or more internal trenches 37, which may be formed in the internal upper and/or lower surfaces of layers 6-7, such as in the lower surface of layer 6, and/or in the upper surface of layer 7.

Figure 2:
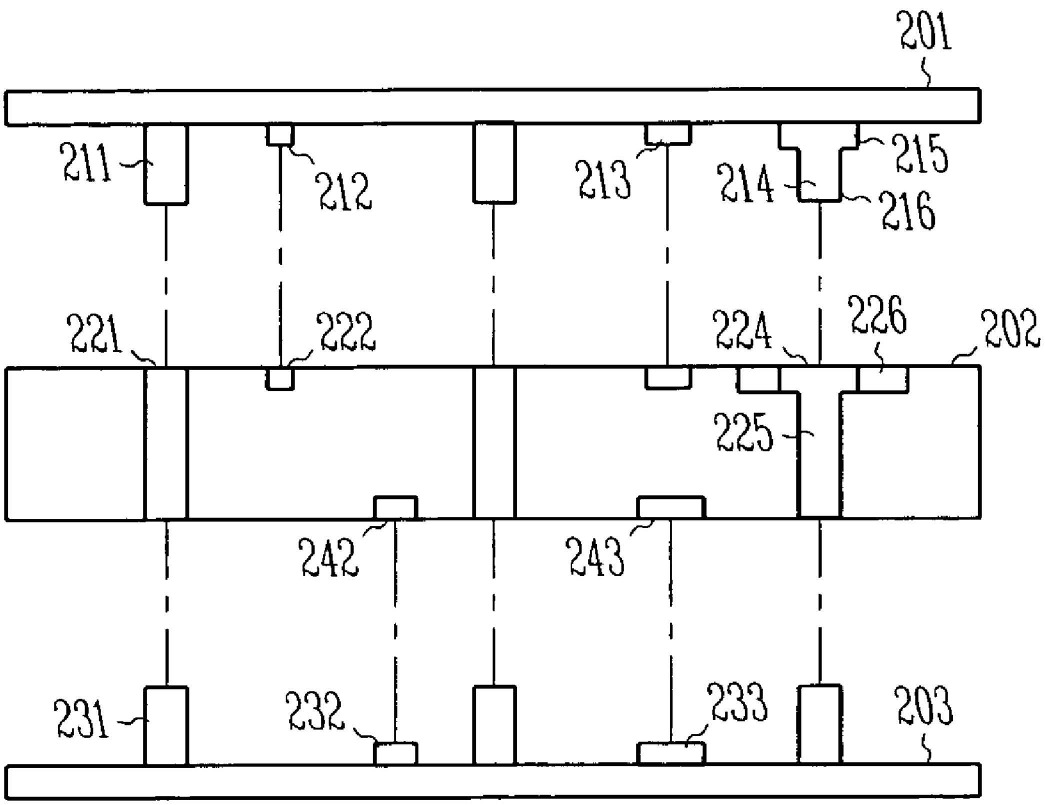
FIG. 2 illustrates a cross-sectional representation of a substrate formed by imprinting, and corresponding upper and lower imprinting elements, in accordance with an embodiment of the invention.

FIG. 2 illustrates a cross-sectional representation of a substrate 202 formed by imprinting, and corresponding upper and lower imprinting elements 201 and 203, in accordance with an embodiment of the invention. Substrate 202, as shown in FIG. 2, can be a self-contained substrate, or it can form part of a multi-layer substrate.

Substrate 202 comprises one or more vias, such as vias 221 and 225. Substrate 202 further comprises one or more trenches, such as trenches 222, 224, 242, and 243. Trenches 222 and 224 (e.g. traces or lands) are in the upper surface of substrate 202, while other trenches, such as trenches 242-243, are in the lower surface of substrate 202.

Via 225 is formed within trench 224. In accordance with the present subject matter, vias, such as via 225, need not be formed within via pads. Via pad 226, shown in dashed outline, depicts a prior art structure (unnecessary in embodiments of the present invention) that is used to assure that vias are drilled within a region of the substrate so that they ultimately make electrical contact with a trace to which the via pad is connected. Via pads, as used in prior art substrate structures, thus provide a fairly wide tolerance with respect to the location of corresponding via holes. A disadvantage of using via pads is the significant amount of real estate they consume on the substrate surface.

In the imprinted substrate 202 depicted in FIG. 2, the trench 224 and the via 225 are formed simultaneously, so there is no need to provide a via pad to assist in registering via 225 with trench 224. By eliminating the need for via pads, the imprinted substrate 202 can accommodate a higher density of conductor features, such as vias, traces, and mounting terminals.

Also shown in FIG. 2 are an upper imprinting element 201 and a lower imprinting element 203. Upper and lower imprinting elements 201 and 203 may be considered imprinting tools. They may also be referred to as stamping tools or micro tools.

Upper imprinting element 201 comprises a plurality of protrusions or dies, such as dies 211-214. Dies 211-214 may be of different geometries. For example, dies 211-214 may have different widths and depths. Dies 211 and 214 have greater depths than dies 212 and 213. Dies 211 and 213 have greater widths than die 212.

Die 214 provides a combination of at least two different geometries. Die 214 includes a relatively wide region 215 at its base, corresponding to trench 224 in the upper surface of substrate 202. Die 214 further includes a narrower region 216, corresponding to via 225 in substrate 202.

Lower imprinting element 203 also comprises a plurality of protrusions or dies, such as dies 231-233. Dies 231-233 may be of different geometries. For example, dies 231-233 may have different widths and depths. Die 231 has a greater depth than die 232. Die 233, to form mounting pad 243, has a greater width than dies 231 and 232.

Figure 3:
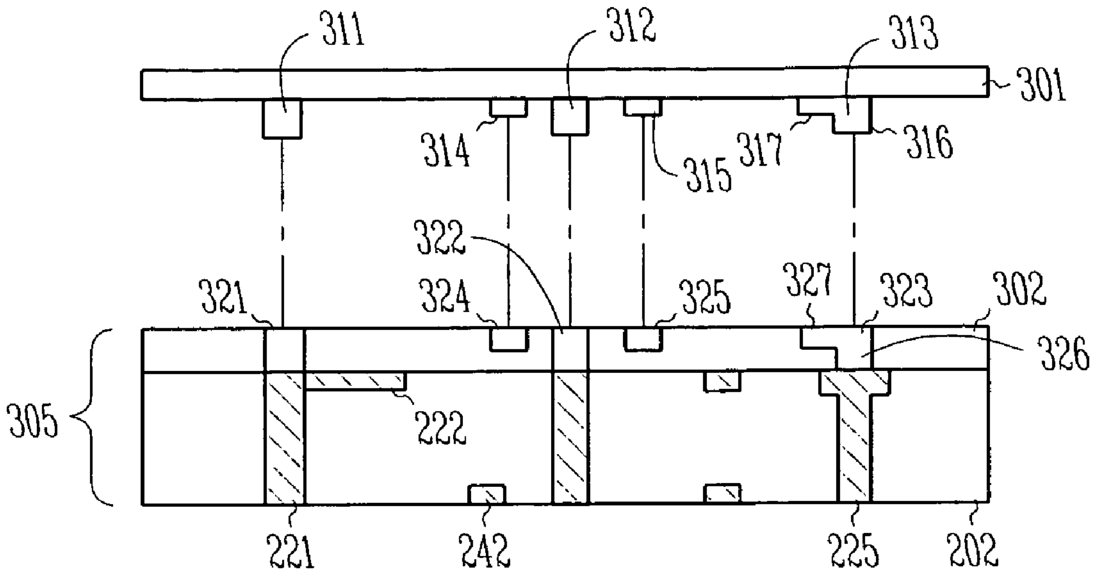
FIG. 3 illustrates a cross-sectional representation of a substrate formed by imprinting, and a corresponding imprinting element having relatively short imprinting dies, in accordance with an embodiment of the invention.

FIG. 3 illustrates a cross-sectional representation of a substrate 305 formed by imprinting, and a corresponding imprinting element 301 having relatively short imprinting dies 311-315, in accordance with an embodiment of the invention. Substrate 305, as shown in FIG. 3, can be a self-contained substrate, or it form part of a multi-layer substrate.

Substrate 305 comprises an upper layer 302 and a lower layer 202. In an exemplary embodiment wherein additional build-up layers (not shown) are added below layer 202, layer 202 could be described as a core layer. For example, in an exemplary embodiment, a number of build-up layers could lie both above and below layer 202. Layer 202 may include internal traces (not shown) situated between multiple layers (not shown). Such internal traces could be formed in any suitable manner, including a manner that is similar to or identical to that used to form trenches 324-325 in upper layer 302, as will be explained in greater detail below.

In the example shown in FIG. 3, layer 202 has been previously imprinted in an imprinting operation. After the imprinting operation, a suitable conductive material such as copper was inserted into the conductor features of layer 202. Thus, vias 221 and 225, and trenches 222 and 242, contain conductive material, as represented by cross-hatching.

After having conductive material applied to it, layer 202 was registered with and coupled to layer 302 to form substrate 305.

Layer 302 comprises a plurality of conductor features that have been formed therein. The conductor features may include vias such as vias 321-323 and trenches such as trenches 324-325.

Also shown in FIG. 3 is an imprinting element 301. Imprinting element 301 includes a plurality of dies 311-315. In the example shown in FIG. 3, the depths of dies 311-313, used to form corresponding vias 321-323 in layer 302, are relatively short, and they do not extend beyond the lower surface of layer 302 when imprinting element 301 is pressed against layer 302.

Die 313 is asymmetrical and is shaped to form a via at or very near the edge of a trench. Die 313 comprises a portion 316 to form via 326. Die 313 further comprises a portion 317 to form trench 327. Portion 317 is offset from portion 316.

Figure 4:
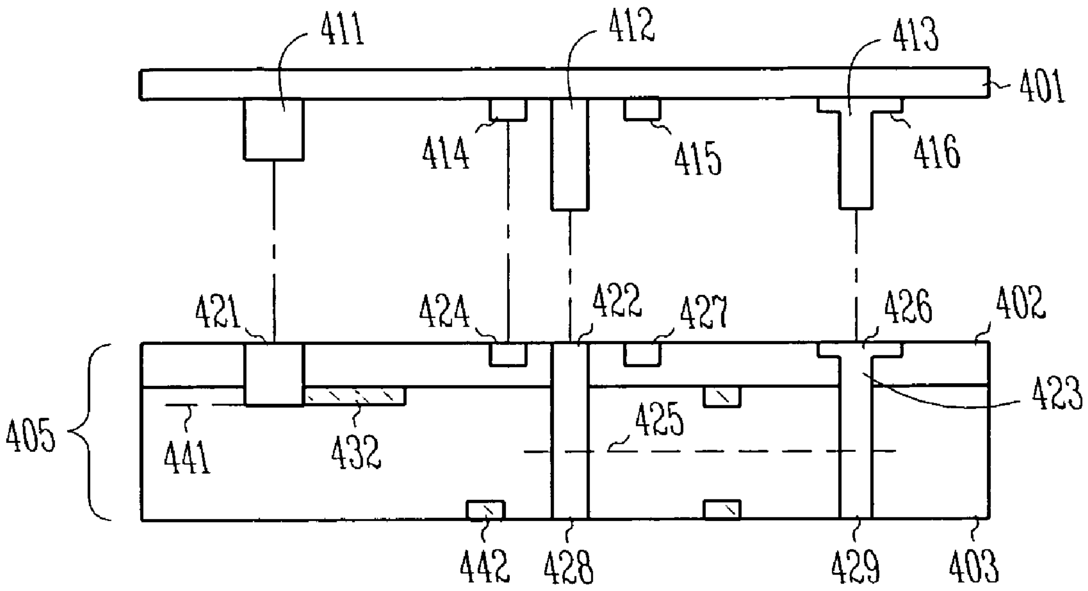
FIG. 4 illustrates a cross-sectional representation of a substrate formed by imprinting, and a corresponding imprinting element having relatively long imprinting dies, in accordance with an embodiment of the invention.

FIG. 4 illustrates a cross-sectional representation of a substrate 405 formed by imprinting, and a corresponding imprinting element 401 having relatively long imprinting dies 412-413, in accordance with an embodiment of the invention. Substrate 405, as shown in FIG. 4, can be a self-contained substrate, or it form part of a multi-layer substrate.

Substrate 405 comprises an upper layer 402 and a lower layer 403. In an exemplary embodiment wherein additional build-up layers (not shown) are added below layer 403, layer 403 could be described as a core layer. For example, in an exemplary embodiment, a number of build-up layers could lie both above and below layer 403. Layer 402 may include internal traces (not shown) situated between multiple layers (not shown). Such internal traces could be formed in any suitable manner, including a manner that is similar to or identical to that used to form trenches 424 and 427 in upper layer 402.

In the example shown in FIG. 4, lower layer 403 has been previously imprinted in an imprinting operation. After the imprinting operation, a suitable conductive material such as copper was inserted into the conductor features of layer 403. Thus, trenches 432 and 442, contain conductive material, as represented by cross-hatching.

After having conductive material applied to it, lower layer 403 was registered with and coupled to upper layer 402. Lower layer 403, which had certain conductor features (e.g. trenches 432 and 442) imprinted in a first imprinting operation (using a different imprinting element than imprinting element 401), may have other conductor features (e.g. vias 421, 422, and 423) imprinted in a second imprinting operation (using imprinting element 401).

Also shown in FIG. 4 is an imprinting element 401. Imprinting element 401 includes a plurality of dies 411-415. In this example, the depths of dies 412-413 that are used to form corresponding vias 422-423 in layer 402, are relatively long, and they extend beyond the lower surface of layer 402 when imprinting element 401 is pressed against layer 402. Dies 412 and 413 may extend as far into layer 403 as dashed line 425.

In the example shown in FIG. 4, upper layer 402 has not been previously imprinted in an imprinting operation. Upper layer 402, in registration with lower layer 403, is imprinted simultaneously with lower layer 403. In such an imprinting operation, various conductor features are formed in upper layer 402. The conductor features may include via 421 (which also extends partly into lower layer 403), vias 422-423, and trenches such as trenches 424 and 427.

As mentioned above, dies 412-413 are used to form vias 422-423. Vias 422-423 pass entirely through upper layer 402 and at least partly into lower layer 403, down to dashed line 425. In the embodiment shown in FIG. 4, the lower portions 428-429 of vias 422-423 within lower layer 403 are formed by corresponding dies of a lower imprinting element (not shown). Alternatively, the lower portions 428-429 of vias 422-423 could be formed by the use of a different imprinting element 401 having longer dies 412-413.

Die 411 of imprinting element 401 is relatively short. Die 411 extends entirely through upper layer 402, forming via 421 therein, and die 411 further extends only to dashed line 441 within lower layer 403.

Dies 414 and 415 of imprinting element 401 are also relatively short, and they are used to form corresponding trenches 424 and 427 in the upper surface of upper layer 402.

Die 413 is shaped to form a via within a trench. Die 413 comprises a relatively long portion 413 to form via 423. Die 413 further comprises a portion 416 to form a corresponding trench 426.

In addition to the examples shown, many other types of substrates can be formed, including printed circuit board (PCB) substrates having one or more layers.

Figure 5:
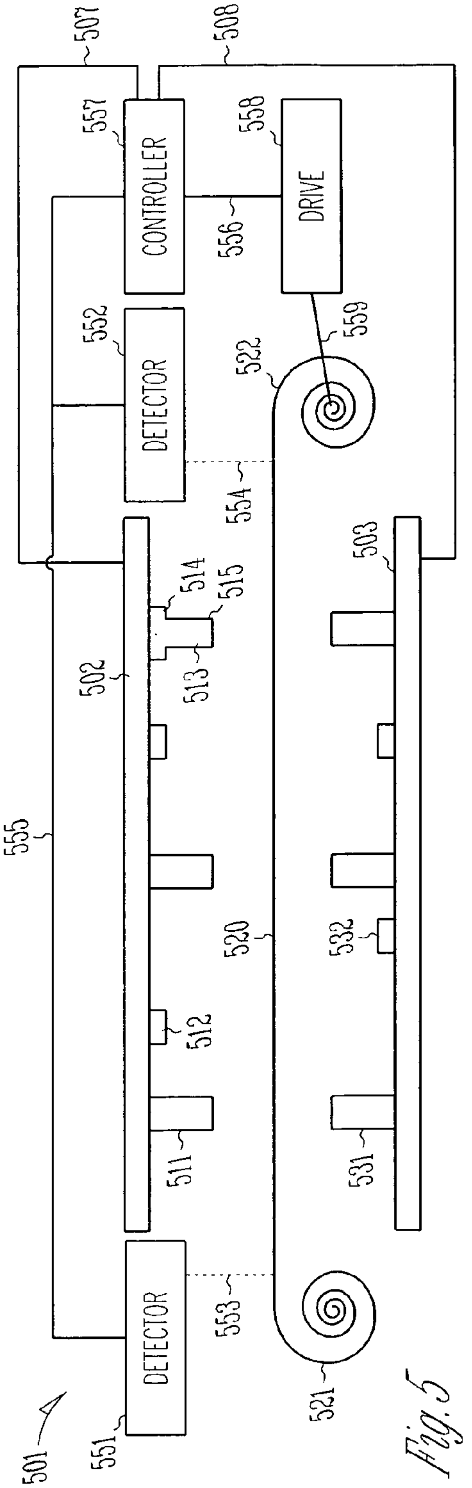
FIG. 5 illustrates a block diagram of a substrate-imprinting apparatus, including a cross-sectional representation of upper and lower imprinting elements, and an imprintable tape, in accordance with an embodiment of the invention.

FIG. 5 illustrates a block diagram of a substrate-imprinting apparatus 501, including a cross-sectional representation of upper and lower imprinting elements 502 and 503, and an imprintable film or tape 520, in accordance with an embodiment of the invention.

Substrate-imprinting apparatus 501, in the example illustrated in FIG. 5, may comprise a tape supply element such as a tape supply roll 521, and a tape take-up element such as tape take-up roll 522. One or both of tape supply roll 521 and tape take-up roll 522 are driven by a suitable drive element, such as drive 558. For example, drive 558 may be coupled to tape take-up roll 522 through a suitable drive shaft 559, gearing, or other drive mechanism.

Imprintable tape 520, which is depicted schematically in FIG. 5, is not drawn to scale and is typically much thicker than shown. Its relative thickness, compared with imprinting elements 502 and 503 may be comparable to that of substrate 202 relative to imprinting elements 201 and 203 (FIG. 2). Imprintable tape 520 may comprise one or more layers. The width of imprintable tape 520 may be approximately the same as that of the substrate being fabricated. In other embodiments, the width of imprintable tape 520 may be wider than that of the substrate being fabricated.

Imprintable film or tape 520 may be formed of material selected from the group comprising bismaleimide resin, such as bismaleimide triazene (known in the art as "BMT"), epoxy, liquid crystal polymer, polycarbonate, polyester, polyether, and polyimide. Optionally, the imprintable tape material may be formed of a polymer, such as polyimide or epoxy, to which particles have been added. For example, the particles may comprise silica, alumina, or fiberglass.

Imprinting elements 502 and 503 may be similar to those discussed above in FIGS. 2-4. Imprinting elements 502 and 503 each comprise a plurality of protrusions or dies. The dies can have different geometries, corresponding to the desired geometries of the set of conductor features to be imprinted into imprintable tape 520. Dies to form vias may have different depths, widths, etc. Likewise, dies to form trenches may have different depths, widths, lengths, etc.

For example, upper imprinting element 502 may comprise a plurality of relatively long dies, such as die 511 and die portion 515 of die 513. Dies 511 and 515 may form vias, or portions of vias, in imprintable tape 520.

Upper imprinting element 502 may also comprise a plurality of relatively short dies, such as die 512 and portion 514 of die 513. Dies 512 and 514 may form trenches (e.g. for traces and/or terminals) in imprintable tape 520.

Similarly, lower imprinting element 503 may comprise a plurality of dies, such as dies 531 and 532. Die 531 is relatively long, and it may be circular in cross-section section, in order to form a corresponding via or portion thereof in imprintable tape 520. Die 532 is relatively short, at least in a cross-sectional depiction; however, it may have a relatively lengthy dimension, as viewed into the drawing, in order to form a relatively long trace, for example.

Imprinting elements may be formed of any suitable material. In an embodiment, the imprinting elements are formed of solid nickel or nickel-plated metal. Other materials with the requisite properties, such as hardness, may also be used. Imprinting elements could be fabricated, for example, by the manufacturers of microtools used to make compact discs ("CDs"), once the present subject matter has been reviewed.

Substrate-imprinting apparatus 501 may include a controller 557. Controller 557 may be coupled to drive 558 through bus 556. Controller 557 may be coupled to upper imprinting element 502 and to lower imprinting element 503 through busses 507 and 508, respectively. Controller 557 may be implemented in any suitable manner, such as through a programmable machine or a fixed-program machine.

Controller 557 may also be coupled to one or more detectors, such as detectors 551 and 552, via bus 555. Detector 552 may detect an alignment feature (e.g. alignment features 641-644, FIG. 6) on imprintable tape 520. Pathway 554 schematically depicts an alignment relationship between an alignment feature on imprintable tape 520 and detector 552. The alignment relationship may be implemented through any suitable alignment mechanism. For example, a relatively narrow light beam originating in detector 552 could be reflected off a reflective area on imprintable tape 520 and detected by an optical receiver within detector 552. Pathway 554 could also represent a magnetic, electrical, mechanical, or other alignment relationship between detector 552 and an alignment feature on imprintable tape 520. For example, pathway 554 could represent a mechanical arm or cog that engages in a hole in imprintable tape 520.

An additional detector, such as detector 551, could also be used to detect an alignment feature on imprintable tape 520 through a corresponding pathway 553. Detectors 551 and 552, and associated pathways 553 and 554, may be of different types and may be located in any suitable place. For example, detectors could be located on the same surface of imprintable tape 520 but on opposite edges; they could be situated on opposite surfaces of imprintable tape 520; etc.

Using input from one or more detectors 551 and 552, controller 557 may adjust the relative positions of the imprintable tape 520, the upper imprinting element 502, and the lower imprinting element 503. Controller 557 may do this by controlling drive 558 and/or by controlling the movement of the upper imprinting element 502 and the lower imprinting element 503 in the X and Y dimensions through suitable control mechanisms (not shown).

When controller 557 determines that everything is properly aligned, controller 557 controls the upper imprinting element 502 and the lower imprinting element 503 in the Z dimension. The upper imprinting element 502 is moved downward into the upper surface of imprintable tape 520, and the lower imprinting element 503 is moved upward into the lower surface of imprintable tape 520.

Figure 6:
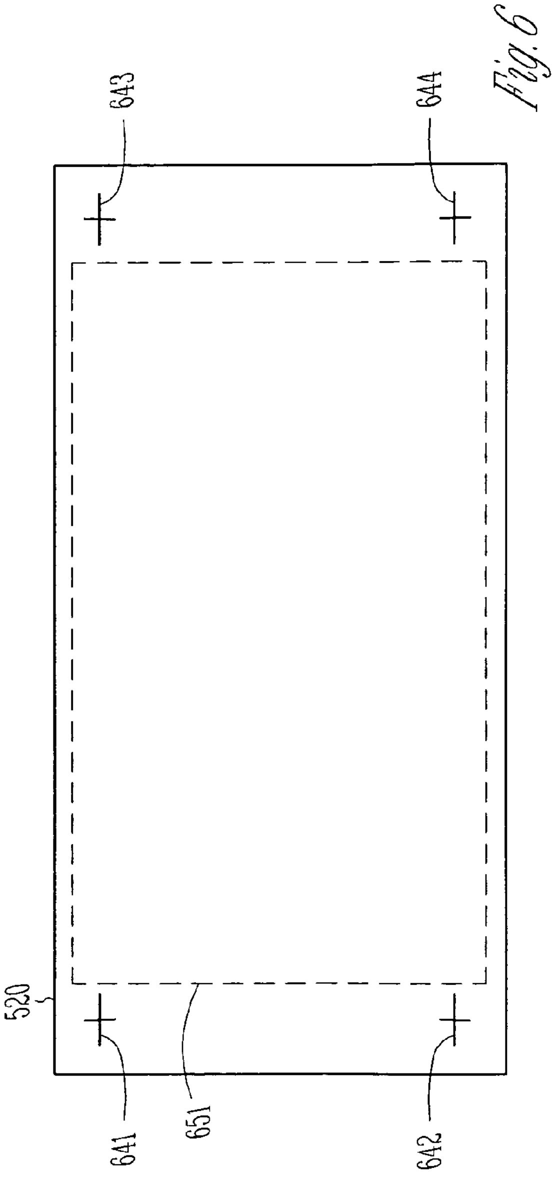
FIG. 6 illustrates a top view of a portion of the imprintable tape shown in FIG. 5 having a pattern of alignment marks thereon, in accordance with an embodiment of the invention.

FIG. 6 illustrates a top view of a portion of the imprintable tape 520 shown in FIG. 5 having a pattern of alignment marks 641-644 thereon, in accordance with an embodiment of the invention.

In the embodiment illustrated in FIG. 6, four alignment marks 641-644 are shown. Alignment marks 641-644 are used to align the imprintable tape 520 in various apparatus used to fabricate substrates. Such apparatus may include, but is not necessarily limited to, the substrate-imprinting apparatus 501 of FIG. 5. Other types of fabrication apparatus using alignment marks 641-644 may include apparatus to join substrate layers, to add or remove material and/or features, to inspect, etc.

More or fewer alignment marks could be used. The alignment marks may have a different shape than that shown. Alignment marks of different shapes, sizes, types, etc. could be used concurrently.

In the embodiment shown in FIG. 6, the alignment marks 641-644 are depicted as positioned outside of a conductor region 651 depicted by a dashed outline.

"Conductor region", as used herein, means an imaginary projection of a region on the substrate, inside of which region all conductor features (as defined earlier) are contained. A "conductor region" is typically substantially square or rectangular, although it need not be limited to such shapes.

In an embodiment, alignment marks 641-644 are positioned outside of conductor region 651 so as not to encroach upon the surface real estate available for conductor features and other substantive elements of the substrate. However, in another embodiment, the alignment marks may be positioned within the conductor region.

In the embodiment illustrated in FIGS. 5 and 6, upper and lower imprinting elements 502 and 503 are sized to imprint in a tape region encompassing only a single substrate segment. By using imprinting elements of reduced size, relative to the surface area of the substrate being imprinted, better control can be achieved in the Z-dimension, that is, the dimension into the substrate material. Both the substrate material and the imprinting element can be flatter, and the imprint depth can be more uniform over the entire surface of the imprinted material, compared to an imprinting system in which a relatively large substrate surface (e.g. comprising a large number of substrate segments side-by-side) is imprinted using an imprinting element having a relatively large surface.

Further, by using imprinting elements and substrate segments that have relatively small surfaces, any required heating and cooling cycles can be carried out more quickly.

Further, because the alignment features are close to the substrate segments, better alignment accuracy can be achieved, resulting in improved yield and reliability.

Figure 7:
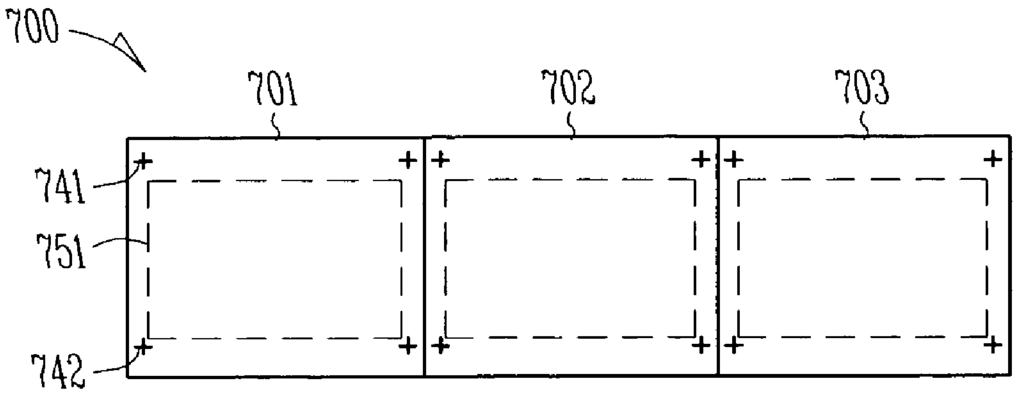
FIG. 7 illustrates a top view of a portion of imprintable tape having a pattern of alignment marks thereon, in accordance with an embodiment of the invention.

FIG. 7 illustrates a top view of a portion of imprintable tape 700 having a pattern of alignment marks thereon, in accordance with an embodiment of the invention.

Imprintable tape 700 comprises a plurality of tape regions or segments 701-703. Each segment 701-703 represents an individual substrate, or a portion of an individual substrate (e.g. a single-layer portion or a multi-layer portion). With respect to one segment 701, it may comprise one or more alignment marks 741 and 742, and it comprises a conductor region 751 shown in dashed outline. The size and position of the conductor region 751, relative to segment 701, may be varied.

Alignment marks 741 and 742 are depicted in this example as outside conductor region 751; however, in other embodiments the alignment marks may be positioned inside the conductor region 751, or alignment marks may be positioned both inside and outside conductor region 751.

Figure 8:
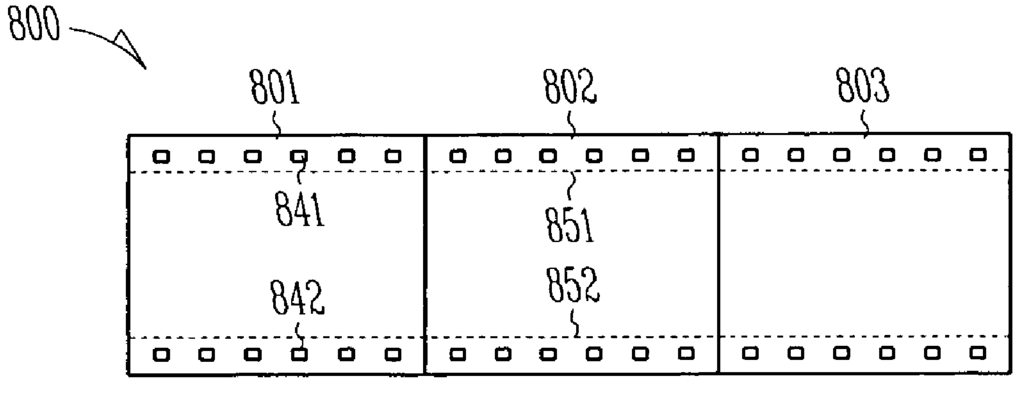
FIG. 8 illustrates a top view of a portion of imprintable tape having a pattern of alignment holes thereon, in accordance with an embodiment of the invention.

FIG. 8 illustrates a top view of a portion of imprintable tape 800 having a pattern of alignment holes thereon, in accordance with an embodiment of the invention.

Imprintable tape 800 comprises a plurality of tape regions or segments 801-803. Each segment 801-803 represents an individual substrate, or a portion of an individual substrate (e.g. a single-layer portion or a multi-layer portion). With respect to one segment 801, it may comprise one or more alignment sprockets or holes 841 and 842, and it comprises a conductor region shown between dashed lines 851 and 852. The size and position of the conductor region, relative to segment 801, may be varied.

Alignment holes 841 and 842 are depicted in this example as outside the conductor region bounded by dashed lines 851 and 852; however, in other embodiments the alignment holes may be positioned inside the conductor region, or alignment holes may be positioned both inside and outside the conductor region.

Alignment holes, such as alignment holes 841 and 842, can be used in conjunction with a suitable transport mechanism (not shown) to facilitate production movement within a high volume manufacturing environment.

Figure 9B:
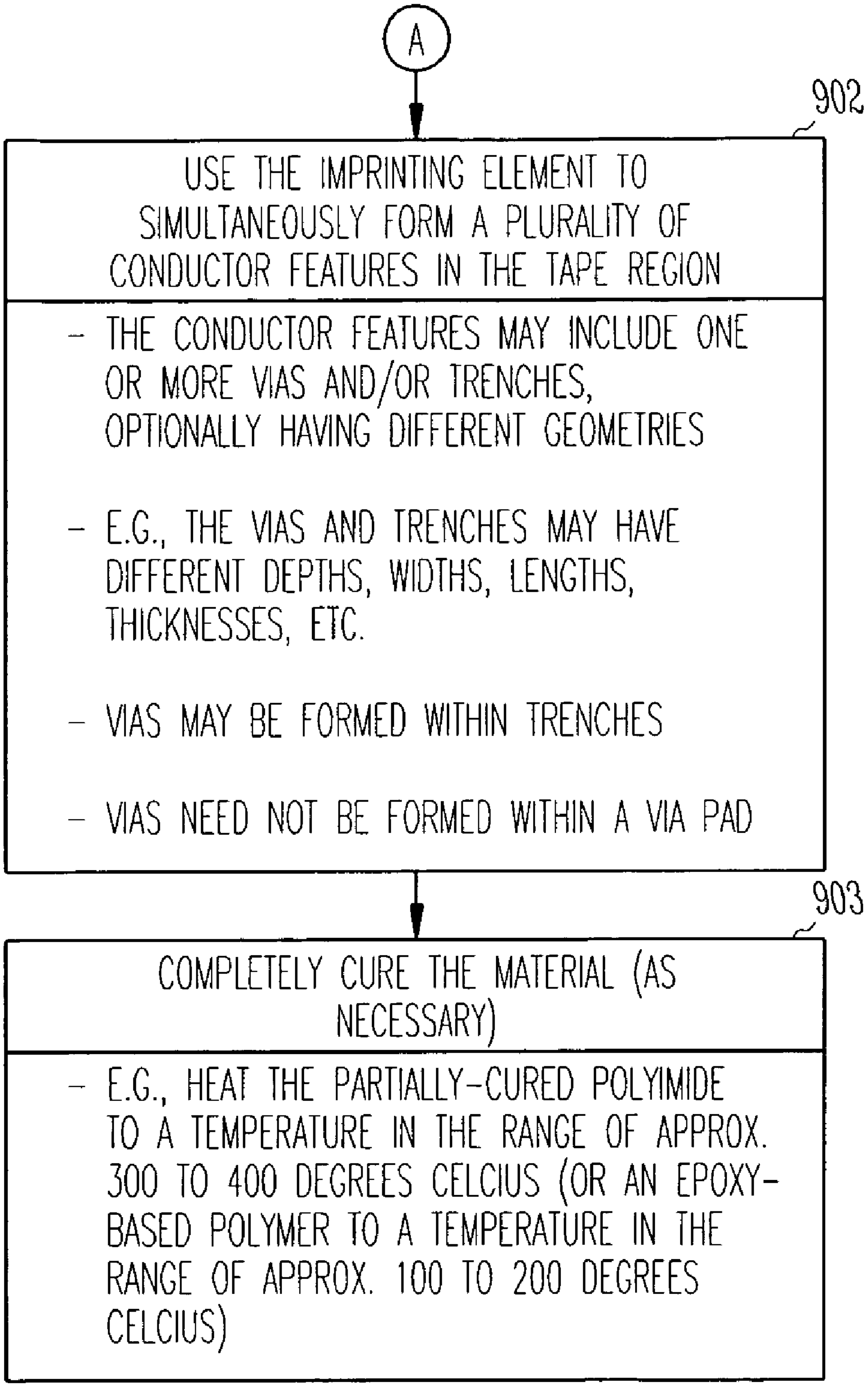

FIGS. 9A and 9B together form a flow diagram illustrating a method of fabricating an imprinted substrate, using an imprintable tape, to mount an electronic component, in accordance with one or more embodiments of the invention.

In 901, a tape of imprintable material is positioned adjacent an imprinting element. The imprinting element is sized to imprint a tape region or segment (such as segment 701, FIG. 7) that encompasses only a single substrate. The substrate is to mount at least one electronic component.

The tape region may include at least one alignment feature, such as one or more holes (e.g. sprocket holes) or optical alignment marks. Any other suitable type of alignment feature could also be used. The alignment feature may be outside the substrate. For example, the alignment feature may be outside a conductor region (e.g. conductor region 751, FIG. 7).

The tape region of the substrate may comprise one or more layers. The substrate may be formed of material selected from the group comprising bismaleimide resin such as bismaleimide triazene (known in the art as "BT"), driclad, epoxy, liquid crystal polymer, polycarbonate, polyester, polyether, and polyimide. Optionally, the substrate material may be formed of a polymer, such as polyimide or epoxy, to which particles have been added. For example, the particles may comprise silica, alumina, or fiberglass.

The substrate material may be heated prior to imprinting. As an example, polyether material may be heated to a temperature in the range of approximately 20 to 250 degrees Celsius prior to imprinting.

The substrate may be formed of a partially-cured material selected from the group comprising bismaleimide resin such as bismaleimide triazene ("BT"), epoxy, polycarbonate, polyester, and polyimide. A partially-cured polymer, referred to in the art as a "B-stage polymer", may be used. The material should be sufficiently soft to be malleable and formable, but it should be sufficiently firm to retain features that are subsequently imprinted into it.

As an example, a partially-cured material may include polyimide heated to a temperature in the range of approximately room temperature (e.g., 20 degrees Celsius) to approximately 250 degrees C. As another example, the partially-cured material may include an epoxy-based polymer heated to a temperature in the range of approximately room temperature to approximately 170 degrees C. Heating may be provided by any suitable apparatus, such as infra-red or microwave radiation, heating coils, etc.

In 902, while maintaining the temperature of the substrate material at the previously described temperature, the imprinting element is used to simultaneously form a plurality of conductor features in the tape region of the substrate. The conductor features may be imprinted in one or both surfaces of the substrate. The set of conductor features may include one or more vias and/or trenches. The conductor features may optionally have different geometries. For example, the conductor features may have different depths, widths, lengths, thicknesses, and the like. Vias may be formed within trenches, e.g. centered within a trench or along the side of a trench. Vias need not be formed within via pads. All conductor features can be formed simultaneously within one or multiple layers.

In 903, if necessary, the substrate material is completely cured through a suitable process. For example, in the above-mentioned example of polyimide, it may be cured by heating it within the range of approximately 300 to 400 degrees C. In the above-mentioned example of an epoxy-based polymer, it may be cured by heating it within the range of approximately 100 to 200 degrees C. It will be understood by those of ordinary skill in the art that the cure times for such substrate materials may be inversely proportional to the cure temperatures. As one example, a substrate formed from a particular epoxy-based polymer may be cured at 170 C for 30 minutes or at 120 C for 90 minutes.

Although not shown in FIGS. 9A-9B, at a suitable point in the process, e.g. subsequent to curing the substrate material (if a curing operation is necessary), an electrically conductive material is inserted into the conductor features. The conductive material can be of any suitable type, such as copper, aluminum, silver, etc. The metallization operation may be performed using a suitable technique such as sputtering, plating, etc. A suitable operation to planarize the substrate may be used subsequent to metallization.

A suitable cleaning operation may be performed on the substrate material, if and when required, for example prior to a curing operation, and/or prior to a metallization operation.

Eventually the imprintable tape is separated or "singulated" into individual segments. After singulation, the individual tape substrate segments may be transported throughout the fabrication environment through any suitable apparatus, such as transport carriers or trays, for subsequent fabrication operations, such as combining them with one or more other substrate layers, inspecting them, and possibly other manufacturing operations.

Other types of suitable imprintable material may be used.

The operations described above with respect to the methods illustrated in FIGS. 9A-9B can be performed in a different order from those described herein.

Embodiments of the present invention provide for the fabrication of electronic substrates that can be fabricated with relatively less complexity, time, and cost, and with relatively greater density compared with known electronic substrates.

An electronic system that incorporates one or more electronic assemblies that utilize the present subject matter can be produced in configurations having reduced cost and enhanced reliability relative to known structures and fabrication methods, and such systems are therefore more commercially attractive.

As shown herein, the present subject matter can be implemented in a number of different embodiments, including an electronic package substrate, an electronic package, various methods of fabricating a substrate, and a machine to fabricate a substrate. Other embodiments will be readily apparent to those of ordinary skill in the art. The elements, materials, geometries, dimensions, and sequence of operations can all be varied to suit particular packaging requirements.

FIGS. 1 through 8 are merely representational and are not drawn to scale. Certain proportions thereof may be exaggerated, while others may be minimized. FIGS. 1-9 are intended to illustrate various implementations of the subject matter that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present subject matter. Therefore, it is manifestly intended that embodiments of this invention be limited only by the claims and the equivalents thereof.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

What is claimed is:

1. An electronic package substrate comprising:

a segment of an imprintable tape;

the segment having an upper surface to mount an electronic component;

the segment having a lower surface; and the segment having a plurality of conductor features in the upper surface and in the lower surface, wherein the plurality of conductor features are formed by imprinting them simultaneously in a conductor region of the imprintable tape encompassing only the segment, wherein the plurality of conductor features include a plurality of vias, and wherein at least a first one of the vias comprises an upper portion formed by imprinting it from the upper surface with a first die of circular cross-section extending into the segment to a depth, wherein the at least first one of the vias further comprises a lower portion formed by imprinting it from the lower surface with a second die of circular cross-section extending into the segment to meet the first die at the depth, and wherein the depth is midway between the upper and lower surfaces.

2. The substrate recited in claim 1, wherein the conductor features comprise at least one trench and at least one via formed within the at least one trench.

3. The substrate recited in claim 1, wherein the conductor features further comprise a plurality of trenches, and wherein the conductor features have different geometries.

4. The substrate recited in claim 3, wherein the plurality of trenches includes trenches of different depths.

5. The substrate recited in claim 1, wherein the plurality of vias includes a second via and a third via, the second via having a different depth than the third via.

6. The substrate recited in claim 2, wherein the at least one trench and the at least one via are formed by simultaneously imprinting them.

7. The substrate recited in claim 6, wherein the at least one via is located asymmetrically at the edge of the at least one trench.

8. An electronic package comprising:

a substrate having a segment of an imprintable tape;

the segment having an upper surface to mount an electronic component;

the segment having a lower surface; and the segment having a plurality of conductor features in the upper surface and in the lower surface, wherein the plurality of conductor features are formed by imprinting them simultaneously in a conductor region of the imprintable tape encompassing only the segment, wherein the plurality of conductor features include a plurality of vias, and wherein at least a first one of the vias is not formed within a via pad and comprises an upper portion of circular cross-section formed by imprinting it from the upper surface with a first die of circular cross-section extending into the segement to a depth, wherein the at least first one of the vias further comprises a lower portion of circular cross-section formed by imprinting it from the lower surface with a second die of circular cross-section extending into the segment to meet the first die at the depth, and wherein the depth is midway between the upper and lower surfaces; and an electronic component coupled to the substrate.

9. The electronic package recited in claim 8, wherein the plurality of conductor features comprise at least one trench and at least one via of the plurality of vias formed within the at least one trench.

10. The electronic package recited in claim 8, wherein the plurality of conductor features comprise a plurality of trenches, and wherein the conductor features have different geometries.

11. The electronic package recited in claim 8, wherein the electronic component comprises an unpackaged integrated circuit.

12. The electronic package recited in claim 8, wherein the electronic component comprises a packaged integrated circuit.

13. An electronic package substrate comprising:

a segment of an imprintable tape;

the segment having an upper surface to mount an electronic component;

the segment having a lower surface; and the segment having a plurality of conductor features in the upper surface and in the lower surface, wherein the plurality of conductor features are formed by imprinting them simultaneously in a conductor region of the imprintable tape encompassing only the segment, wherein the plurality of conductor features include a plurality of vias, wherein at least a first one of the vias is not formed within a via pad and comprises an upper portion of circular cross-section formed by imprinting it from the upper surface with a first die of circular cross-section extending into the segment to a depth, wherein the at least first one of the vias further comprises a lower portion of circular cross-section formed by imprinting it from the lower surface with a second die of circular cross-section extending into the segment to meet the first die at the depth, and wherein the depth is midway between the upper and lower surfaces;

wherein the plurality of conductor features comprise at least one trench, and at least one via of the plurality of vias is formed within the at least one trench.

14. The substrate recited in claim 13, wherein the conductor features comprise a plurality of trenches, and wherein the conductor features have different geometries.

15. The substrate recited in claim 14, wherein the trenches have different depths.

16. The substrate recited in claim 14, wherein the trenches have different widths.

17. The substrate recited in claim 13, wherein the plurality of vias have different depths.

18. The substrate recited in claim 13, wherein the plurality of vias have different widths.

19. The substrate recited in claim 13, wherein the conductor features comprise at least two vias of the plurality of vias each having a different width.

20. The substrate recited in claim 13, wherein the conductor features comprise at least two vias of the plurality of vias each having a different depth.

21. The substrate recited in claim 13, wherein the conductor features comprise at least one via of the plurality of vias not formed within a via pad.

22. The substrate recited in claim 13, wherein the tape is formed of material selected from the group comprising bismaleimide, driclad, epoxy, liquid crystal polymer, polycarbonate, polyester, polyether, and polyimide.

23. The substrate recited in claim 13, wherein the tape is formed of partially-cured material selected from the group comprising bismaleimide, epoxy, polycarbonate, polyester, and polyimide.

24. The substrate recited in claim 23, wherein the partially-cured material comprises a filled polymer.

25. The substrate recited in claim 24, wherein the filled polymer comprises material selected from the group consisting of epoxy and polyimide, wherein the selected material comprises a particle filler selected from the group consisting of alumina, fiberglass, and silica.

* * * * *

UNITED STATES PATENT AND TRADEMARK OFFICE

CERTIFICATE OF CORRECTION

PATENT NO. : 7,371,975 B2
APPLICATION NO. : 10/322902
DATED : May 13, 2008
INVENTOR(S) : Dory et al.

It is certified that error appears in the above-identified patent and that said Letters Patent is hereby corrected as shown below:

In column 14, line 4, in Claim 8, after "the vias" delete "is not formed within a via pad and".

In column 14, line 5, in Claim 8, after "portion" delete "of circular cross-section".

In column 14, line 8, in Claim 8, delete "segement" and insert -- segment --, therefor.

In column 14, lines 9-10, in Claim 8, after "portion" delete "of circular cross-section".

In column 14, line 43, in Claim 13, before "comprises" delete "is not formed within a via pad and".

In column 14, line 44, in Claim 13, after "portion" delete "of circular cross-section".

In column 14, line 48, in Claim 13, after "portion" delete "of circular cross-section".

Signed and Sealed this

Twenty-fifth Day of November, 2008

JON W. DUDAS
*Director of the United States Patent and Trademark Office*